United States Patent [19]
Gaines

[11] Patent Number: 5,967,293
[45] Date of Patent: Oct. 19, 1999

[54] BELT FEEDER FOR COMPONENT DELIVERY SYSTEM WITH INTERMITTENTLY MOVING CONVEYOR

[75] Inventor: Jefferson J. Gaines, Tucson, Ariz.

[73] Assignee: U.S. Vibra, Inc., Tucson, Ariz.

[21] Appl. No.: 08/697,909

[22] Filed: Aug. 30, 1996

[51] Int. Cl.$^6$ ............... B65G 29/00; B65G 37/00; B65G 47/26; B65G 47/04
[52] U.S. Cl. ............... 198/464.2; 198/463.4; 198/358; 198/432; 198/433; 198/531
[58] Field of Search ............... 198/464.2, 468.4, 198/418.1, 531, 463.4, 463.6, 432, 433, 448, 358; 414/276

[56] References Cited

U.S. PATENT DOCUMENTS

| | | | |
|---|---|---|---|
| 2,397,339 | 3/1946 | Crosby | 214/23 X |
| 3,179,231 | 4/1965 | Craig | 198/32 X |
| 3,367,534 | 2/1968 | Carter, III | 221/68 |
| 3,463,291 | 8/1969 | Cummings | 198/30 X |
| 3,680,692 | 8/1972 | Southworth | 198/21 X |
| 3,884,343 | 5/1975 | Stephens et al. | 198/233 X |
| 4,261,456 | 4/1981 | Scarpa et al. | 198/460 |
| 4,601,382 | 7/1986 | Roberts et al. | 198/432 X |
| 4,724,947 | 2/1988 | Opperthauser | 198/463.4 |
| 5,167,316 | 12/1992 | Kaminski | 198/463.4 |

*Primary Examiner*—William E. Terrell
*Assistant Examiner*—K W Bower

*Attorney, Agent, or Firm*—Richard R. Mybeck; Peter B. Scull

[57] ABSTRACT

A belt feeder for the rapid and successive in-line transportation of small electronic components. The belt feeder has an inclined dispensing portion with at least one dispensing lane, a conveyor portion having an intermittently moving conveyor belt and at least one conveyor guide lane superposed above the conveyor belt, and a receiving nose structure having at least one nest structure mounted thereon at the end of the conveyor belt and forming a nest. The inclined track is positioned adjacent and above the conveyor track to allow the components enough space to be successively dispensed to the conveyor belt from the dispensing lane and into the conveyor guide lane where the component is intermittently carried forward by the conveyor belt until it comes to rest within its nest. A sensor system repetitively starts then stops the conveyor belt in response to the action of a pick and place or robotic assembly machine so that when the component is picked, leaving an empty nest, the next component is advanced into the nest. A solenoid-operated reciprocating sub-structure is used to intermittently move the nest structure out, away from the component in the nest and then back to receive the next component. A component brake device may be attached to the reciprocating sub-structure to provide braking of the components on the conveyor belt when the nest structure is moved out, away from the component receiving point. An optional component brake assembly superposed above the conveyor belt is also described.

15 Claims, 4 Drawing Sheets

BELT FEEDER FOR COMPONENT DELIVERY SYSTEM WITH INTERMITTENTLY MOVING CONVEYOR

The present invention relates generally to component delivery systems and more specifically to a conveyer belt-type feeder which delivers component parts to a predetermined pickup location for pickup by robotic or "pick and place" machinery in an automated assembly system.

BACKGROUND OF THE INVENTION

The programmable assembly of electronic equipment made from a plurality of electronic components has generated a need for adaptable feeder units which are ready to mount into existing work envelopes for use with pick and place machinery and robotic work stations. In a particular example, electronic component feeders used in the pick and place or robotic assembly of integrated circuit boards and like electronics applications must provide steady and dependable delivery of components to a given work site. It is also important that each component be delivered within a certain time frame and in the correct orientation so that each component can properly interface with the automatic pick and place or robotic machinery to ensure that the preset scheduling of an efficient production line is maintained.

One of the problems with many existing component feeders is their common inability to concurrently deliver several diverse components to the pickup machinery. Numerous current assembly processes are limited because many feeders can only feed one type of component at a time. This then requires a time-consuming series of sequential pickups of the different components by the pickup machinery, often from various different pick locations which results in a longer production time and hence, a much less efficient process.

Another problem with presently available component feeders is their common reliance on tube feeding. Typically, components are stored and shipped in tubes which are later mounted in a conventional component feeder for ultimate delivery to the pickup machinery. The dependence on these tubes often makes the existing feeders less efficient because the components will at times jam in the tubes or in the tube to feeder transition. This results in missed picks because either no component is delivered to the pick location or components are delivered in the wrong orientation or at the wrong time.

Yet another problem with many existing component feeders is that even without tube feeding, the components will often jam in their feeder delivery lanes. These lanes are often either too narrow or too large to allow for smooth passage of the respective components. When such a jam occurs, the assembly process must be stopped and the delivery lane cleared of the jammed components. Improperly sized delivery lanes can also cause the components to arrive misoriented at the pick location. The pickup machinery would thus pick up a component which would have to be reoriented, often manually, before it could be correctly placed in a circuit board thereby causing further interruption of the assembly cycle.

Jamming or misorientation of parts is also a problem with many feeders which rely on gravity to move the parts down to the pick location. Gravity feed problems usually occur when large quantities of components are stacked behind the lead component. The components stacked behind the lead component present a cumulative weight which presses down on the lead component. The larger the cumulative weight, the greater the force which is present to push the lead part into its nest structure at the pickup location. This cumulative weight force will also be referred to as a "back pressure" force. This "back pressure" force often coacts with the inherent frictional characteristics of the nest structure to hold the lead component therein frictionally and, of course, the greater the "back pressure" force, the greater the frictional force holding the part in the nest structure to resist the lifting force of the pick and place machine when it attempts to lift the part from the nest.

A still further problem that is endemic to many existing belt feeders is that they use a continuous belt motion during operation. A continuously moving belt is undesirable because it continuously grinds on the components, particularly when these delicate components are held immobile at the pick point location waiting to be retrieved by the pickup machinery. Even though the component is stationary, the component pins usually remain in contact with the moving belt which may then wear away the plating on the pins and/or may also grind against other important architectural features of the component.

The above problems generally result in lost manufacturing capacity, higher rejection rates and greater attendant costs due to damaged components, and/or ultimately, excessive assembly downtime. Therefore, there exists a need for improved, efficient belt component feeders for the manufacturing of electronic assemblies. Such component feeders should consistently provide stable, non-continuous, non-abrasive delivery of a variety of multiple components to preselected pick locations within the proper time frame and in the proper orientation. It is toward these goals that the present invention is directed.

BRIEF SUMMARY OF THE INVENTION

The present invention relates generally to an improved electronic component delivery device and more specifically to a unique belt feeder which provides stable and timely delivery of one or more properly oriented components to one or more respective pick locations so that a pick and place or robotic assembly machine can efficiently pick up and place the components in a circuit board or other electronic assembly. Preferably, a plurality of parallel pick locations are provided so that simultaneous pickup of diverse components is available. The present belt feeder includes an intermittently moving conveyor belt which can be synchronized with the independent action of the component pickup machinery.

The belt feeder of the present invention further comprises dispensing means for continuously dispensing components to a conveyor means which intermittently transports the components to a receiving means located at the pick location where the pick and place or robotic assembly machine arrives to pick up each component and move it to and place it in a desired location in an electronic assembly. A control means detects when the pick and place pick head leaves the pick location after picking up a component and then the control means automatically triggers the conveyor means to advance the next component into the receiving means. The belt feeder quickly repeats the cycle of advancing a component, waiting for the component to be picked and then advancing the next component continuously so long as there are components to be dispensed to the conveyor means. Further, the cycle may continue uninterrupted by the reloading of additional components into the back of the dispensing means while the conveyor means continues its intermittent feeding action. The preferred embodiment also includes a receiving means which is reciprocally movable from its receiving position at the end of the conveyor means to a second position disposed a preselected distance outwardly therefrom and then back to the initial receiving position. The movement to the outward second position overcomes the jamming caused by the back pressure frictional force by leaving the component in the proper pick position but removing the contact friction force of the receiving means nest on the component. The receiving means reciprocating cycle is also initially triggered by the control means when the pickup machinery pick head leaves the pick point vicinity.

Two other exemplary alternative means for reducing part jamming due to back pressure and friction are also disclosed. One involves a part brake assemblage which is disposed under the conveyor belt and either continuously or reciprocally pushes upward on the belt to interrupt the back pressure force. Another specific means includes a solenoid driven finger assembly which may be disposed above the parts on the conveyor belt. The finger assembly is intermittently (in proper controlled succession relative to all other device movements) caused to rotate its finger downward onto the lines of parts on the conveyor belt to arrest the back pressure force.

Accordingly, the principal object of the present invention is to provide a new and useful belt feeder for electronic component delivery systems which delivers electronic components to preselected pick locations in the proper orientation and at the proper time to permit fast and accurate pickup and placement of the delivered component in an electronic assembly system.

A further object of the present invention is to provide a new and improved belt feeder which delivers diverse types of components concurrently to designated pick locations for single or concurrent pickup by a pick and place or robotic assembly machine.

Another object of the present invention is to provide a unique belt feeder that employs conveyor means which programmably start and/or stop in proper succession relative to the motion of an independent pickup machine to thereby intermittently advance components thereto and avoid abrasive wear of the components.

Still another object of the present invention is to provide means for reducing jamming due to friction at the component pickup location.

A still further object of the present invention is to provide reciprocating movement of feeder receiving means away from the component parts disposed in the pick point locations for pickup by pick and place or robotic assembly machinery.

Yet another object of the present invention is to provide means for relieving back pressure on components disposed at the component pickup locations.

A still further object of the present invention is to provide alternative means for contacting components on the conveyor means to relieve back pressure imparted thereupon.

These and still further objects as shall hereinafter appear are readily fulfilled by the novel belt feeder of the present invention in a remarkably unexpected manner as will be readily discerned from the following detailed description of an exemplary embodiment thereof especially when read in conjunction with the accompanying drawings in which like parts bear like numerals throughout the several views.

DESCRIPTION OF PREFERRED EMBODIMENTS

A belt feeder constructed according to the present invention is shown in the accompanying drawings and is identified by the reference number 20. As shown most basically in FIG. 1, the preferred embodiment of a belt feeder 20 generally includes a housing 22; a dispensing means comprising an inclined feed portion 24; and a conveyor means comprising a conveyor feed portion 26.

Figures 1, 2, 3, 4:
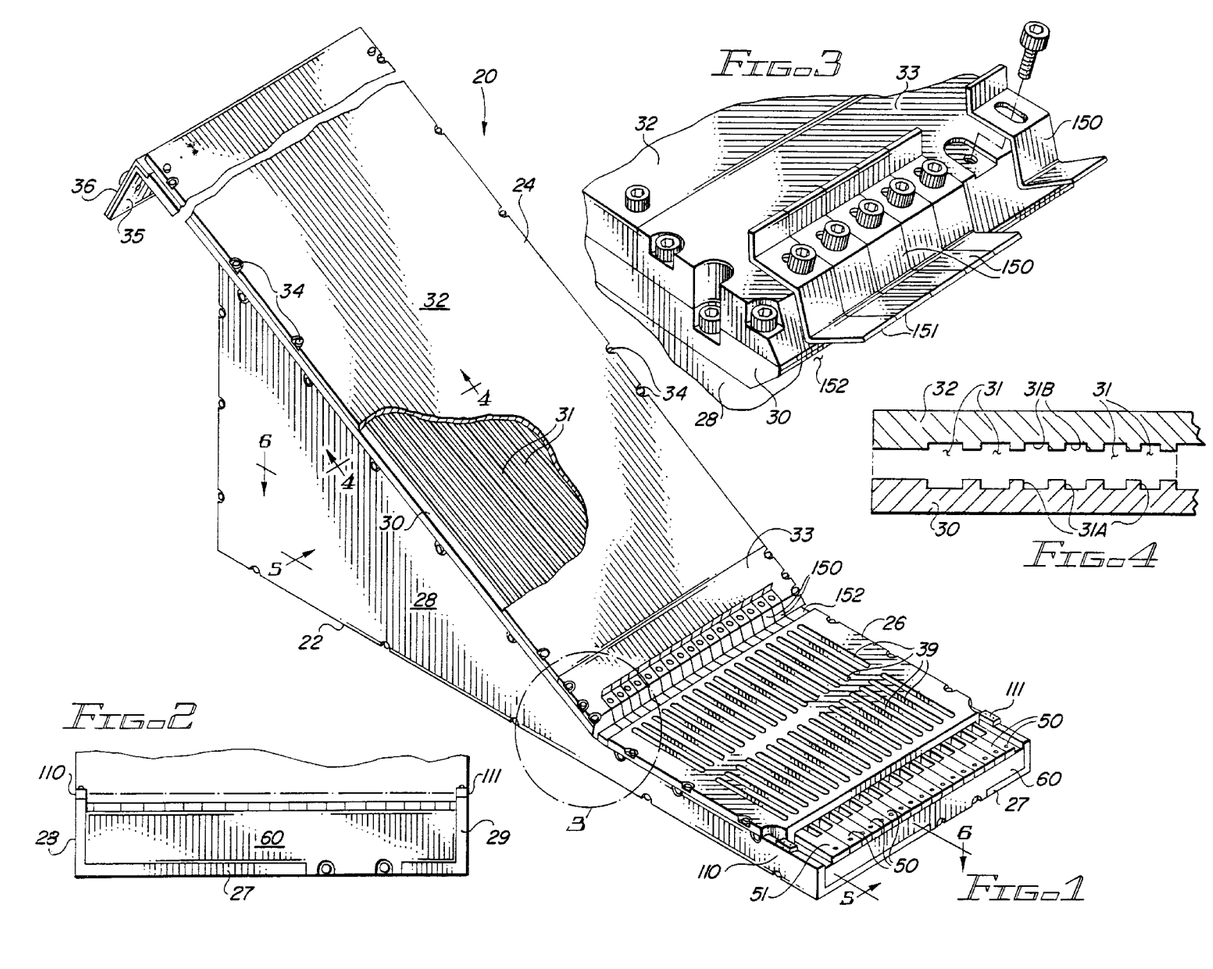
FIG. 1 is an isometric view, partially broken-away, of a belt feeder embodying the present invention.
FIG. 2 is a front elevation, partially broken-away, of the belt feeder of FIG. 1.
FIG. 3 is an enlarged, fragmentary view of the area designated "3" in FIG. 1.
FIG. 4 is a cross-sectional view, partially broken-away, of the feeder of FIG. 1 taken on line 4—4 thereof.

As shown in FIGS. 1 and 2, housing 22 has a base plate 27, a first side plate 28, a second side plate 29 and a rear plate (not shown); and a receiving means characterized by one or more nest structure(s) 50 and/or 51. Housing 22 is adapted to be securely mounted in an electronic assembly system as is generally known in the art.

The preferred dispensing means is detachably and interchangeably attached to housing 22 and includes an interchangeable inclined bottom plate 30 with one or more tooled component lanes 31 formed therein for guiding and/or storing various types of components (not shown in FIGS. 1 and 2) prior to the components being moved to the conveyor means. A tooled lane 31 is a lane which has been customized to accommodate a corresponding component structure. Preferably, each lane 31 is enclosed, top and bottom (see FIG. 4, for example). Thus, when a component is in a lane 31, it cannot escape from the lane except, as is desired, from the open feed end of the lane which is to be described below. The force used to move the components through each dispensing lane 31 toward the juncture where they pass to the conveyor means may be active or passive. The passive force of gravity is preferred. Inclining plate 30 of the dispensing means relative to the generally horizontal operating posture of the conveyor means allows gravity to smoothly and efficiently pull the components in each dispensing lane 31 down to the conveyor means.

An inclined plate 30 with a plurality of component lanes 31 formed therein is detachably mounted to housing 22 as shown by the multiple threaded connections 34 in FIG. 1. Though all of the lanes 31 shown appear to have approximately the same dimensions in FIGS. 1 and 4, each lane may have a different width, height, or other dimensions relative to all other lanes 31 so that belt feeder 20 may simultaneously accommodate a variety of electronic component sizes or types. Such variety will be described further below.

An upper cover plate 32 is mounted over the upper portion of plate 30 to enclose lanes 31. Note, as shown in FIG. 4, lanes 31 may be tooled (i.e., formed) in either or both bottom and cover plates 30 and 32 respectively. Lane portions 31A are shown formed in bottom plate 30 and portions 31B in cover plate 32. An optional lower cover plate 33 may be mounted over the lower end portion of plate 30 to enclose the lower ends of lanes 31. Lower plate 33 provides for the use of a plurality of optional springs 150 (see FIG. 3) which may be mounted to the upper surface of lower cover plate 33 such that each flexible end 151 of each spring 150 is disposed directly over the extreme forward end of each corresponding dispensing lane 31 as shown in FIGS. 1 and 3. More details regarding these optional springs will be presented below.

Mounted onto the rear end of plate 30 is a menu holder 35 covered by a clear plastic panel 36 which provides a window through which the operator can selectively identify which components are disposed in which corresponding component lanes 31. Generally, panel 36 is made of clear PLEXIGLASS or the like and is removably attached (using screws, bolts or the like) to holder 35. A piece of paper or other markable structure could be removably mounted under panel 36 to provide the desired interchangeable visible display.

Figures 5, 15A, 15B:
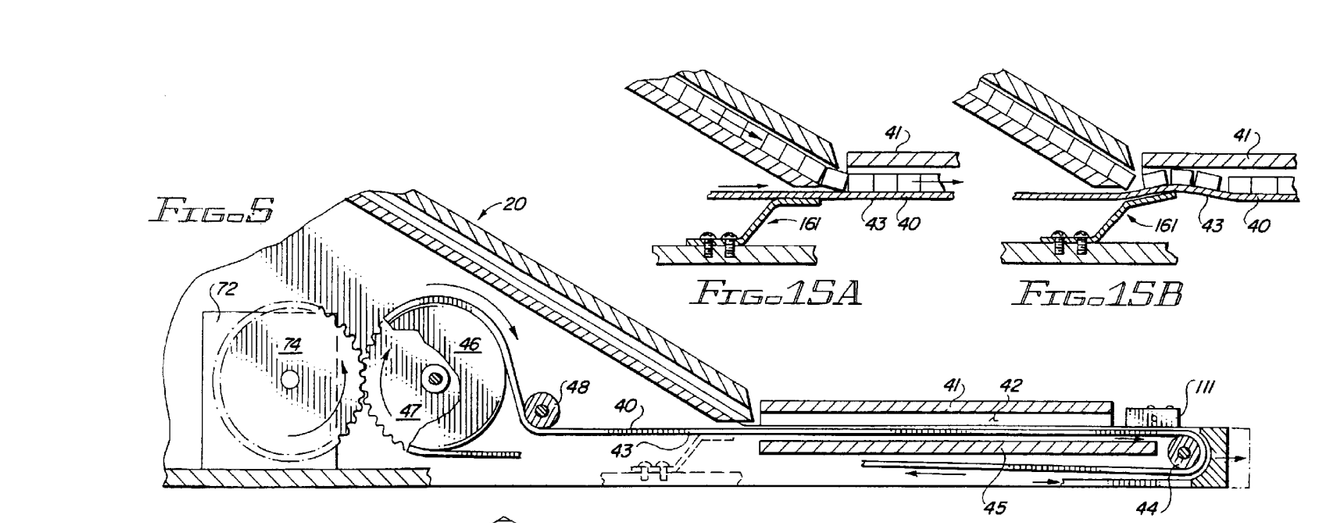
FIG. 5 is a cross-sectional view, partially broken-away, of the feeder of FIG. 1 taken on line 5—5 thereof.
FIG. 15A is a side elevation of the component brake assembly of FIG. 14 mounted in its first, idle position within a belt feeder of the present invention.
FIG. 15B is a second side elevation of the component brake assembly of FIG. 14 in its second, operative position within a belt feeder of the present invention.

As shown best in FIG. 5, the conveyor means generally includes a continuous conveyor belt loop 40 and an interchangeable flat cover plate 41. Cover plate 41 has, on the underside thereof, one or more tooled, component conveyor guide lanes 42 that are disposed in spaced, parallel relationship above belt loop 40. Lanes 42 are formed on the underside of plate 41 similarly to those lane portions 31B shown disposed in upper cover plate 32 as described above (see FIG. 4). The conveyor means is disposed sufficiently near the bottom feed end of the dispensing means so that a component emerging from a dispensing lane 31 of the dispensing means then comes into contact with conveyor belt 40. The component then smoothly advances from the dispensing means fully onto conveyor belt 40 and fully into and through a corresponding conveyor lane 42. The conveyor means intermittently moves each component, in a stop and go fashion, to the receiving means where each component comes to rest at a pick point where it awaits pickup by the pickup machinery. Both dispensing lanes 31, and corresponding component guide lanes 42 are preferably tooled to within about 0.005 to 0.010 of an inch of the width or diameter of the component they are designed to convey. This optimal tolerance range has been found to promote the smooth advancement of component parts through these lanes to aid in avoiding the problem of jammed lanes.

Slots 39 (see FIG. 1) may be formed through plate 41 above each lane 42 primarily to provide visual confirmation of the movement of components therethrough. Slots 39 are not as wide nor as long as lanes 42 to prevent the escape of components therethrough. Slots 39 also may be used to allow operable movement of fingers 180 of optional brake assembly 170 to move into contact with components 95 as will be described in more detail below (See FIGS. 16A and 16B).

Figures 6, 7, 8A, 8B, 11:
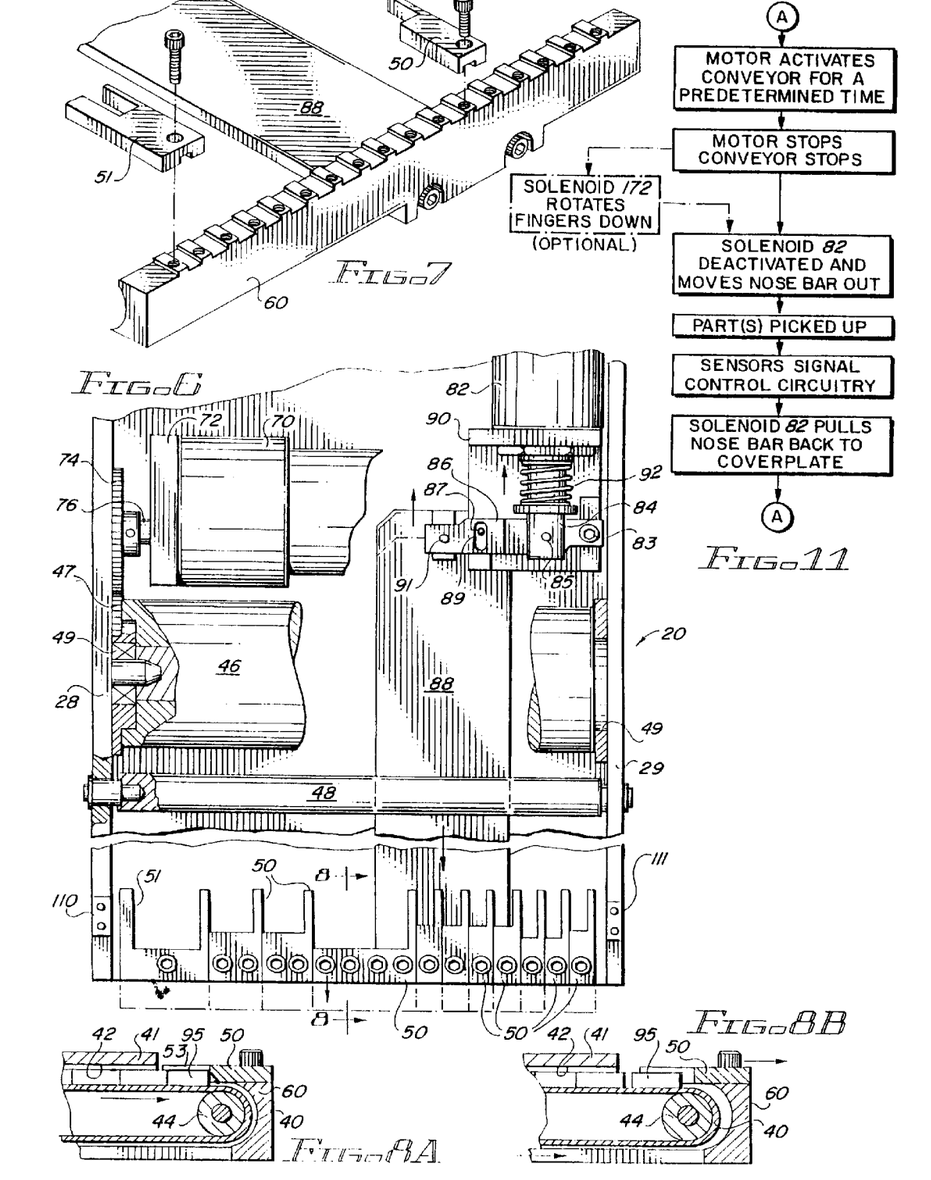
FIG. 6 is a cross-sectional view, partially broken-away, of the feeder of FIG. 1 taken on line 6—6 thereof.
FIG. 7 is a partially exploded isometric view of a portion of a receiving means of the present invention.
FIG. 8A is a cross-sectional view of the feeder of FIG. 6 taken on line 8—8 thereof with the receiving means at a first position.
FIG. 8B is a cross-sectional view of the feeder of FIG. 6 taken on line 8—8 with the receiving means at a second position.
FIG. 11 is a schematic diagram showing the steps controlled by the control means of the present invention.

As shown by FIGS. 1 and 5, the operable, component moving portion of continuous belt loop 40 is disposed in the lower forward region of housing 22, and is disposed around a front roller 44, a belt support plate 45, and a driven belt drum 46. Front roller 44, belt support plate 45 and driven belt drum 46 are each operatively interposed between first side plate 28 and second side plate 29 of housing 22 as shown in FIG. 6, for example, where drum 46 is connected through bearing structures 49 to plates 28, 29. Roller 44 and drum 46 coact to pull belt loop 40 substantially taut. A tension roller 48 is also mounted between first side plate 28 and second side plate 29 to span the width of housing 22 at a position between front roller 44 and belt drum 46 so that tension roller 48 presses against belt loop 40 to thereby make belt loop 40 operably taut. This is most clearly shown in FIG. 5.

As shown in FIGS. 1 and 6, the receiving means includes at least one or more "nest" structures 50, 51 which are permanently or preferably, interchangeably disposed at the delivery end of belt feeder 20. These "nests" 50, 51 are designed to closely fit each respective component to be received. These nests are designed so that a component positioned therein is held in a predetermined orientation allowing for the efficient pickup of the component for placement in the electronic device being assembled by the pick and place or robotic system. The receiving means nest structures 50, 51 are also preferably tooled to within about 0.005 and 0.010 of an inch of the physical dimensions of the component received. Most often, only one component at a time is held by each nest structure 50, 51. A plurality of nest structures 50 are disposed adjacent and parallel to each other with one end nest 51 disposed at the proper end of this configuration (see also FIG. 7). Thus, belt feeder 20 has a plurality of parallel conveyor guide lanes 42 which will provide for the simultaneous advancement of a row of components into a plurality of parallel nest structures 50, 51 for pick up of components either singly, serially or simultaneously by the pick and place or robotic assembly machine.

More specifically, a plurality of component nest structures 50 are mounted adjoining one another on a nosebar 60 as shown in FIGS. 6 and 7. Note the multiple nest structures have different nest sizes, lengths and widths. This demonstrates that there is a great variety of components that can be simultaneously or otherwise fed by a feeder 20 of the present invention. Nosebar 60 is, as shown in FIG. 7, then attached to a slide member 88 (to be described).

Figure 9:
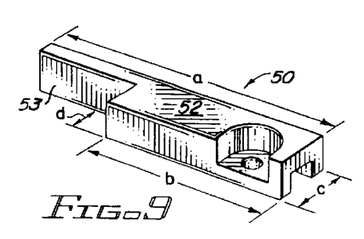
FIG. 9 is an isometric view of an interchangeable nest structure of the present invention.
Figure 10:
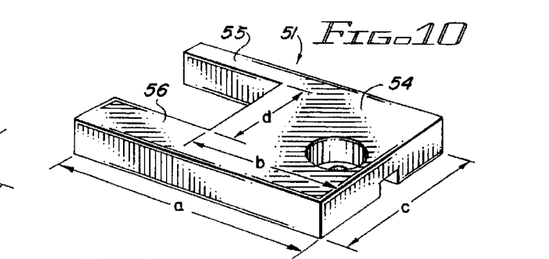
FIG. 10 is an isometric view of another interchangeable nest structure of the present invention.

A nest structure 50 is, as shown in FIG. 9, a substantially L-shaped member with a base 52 and an arm 53. When mounted on a nosebar 60, each nest structure 50 forms a space (also known as a "nest") between the inside surface of the arm 53 of one nest structure and the outside surface of the arm of the neighboring nest structure. See FIGS. 1 and 6. The dimensions of the nest are preferably from about 0.005 to 0.010 of an inch wider than the physical dimensions of the respective components which are specifically intended to be received therein. An end nest structure 51 occupies the end position on nosebar 60 as shown in FIGS. 1, 6 and 7. End nest structure 51 is, as shown in FIG. 10, a substantially U-shaped member having a base 54 and two arms 55, 56. Inner arm 55 is substantially identical to an arm 53 of a nest structure 50. Outer arm 56 is sized to ensure that outboard nest structure 50 is less than or flush with first side plate 28 and yet forms a nest of an appropriate size and dimension to accommodate the components to be fed thereto.

The sizes of the various nest structures 50, 51 are, as mentioned above, variable depending on the components to be fed thereto. However, the lengths "a" as shown in FIGS. 9 and 10 are preferably the same from one nest to another similarly sized nest where the lengths "b" are made variable from one nest structure to the next. Likewise, the widths "c" of the bases are preferably maintained equal (when possible) while the widths "d" are made variable from one nest structure to the next. These variations are preferred so that reprogramming of the automatic or robotic pick and place machine is kept at a minimum even when exchanging these variously sized interchangeable nests. In other words, variation of the "b" and "d" dimensions minimize changes in the center line positions (x and y coordinates) of the various component parts which come to rest in nests 50, 51. Thus, reprogramming is minimized. Also, the center line pickup location is maintained as much as possible so that the eyebeam sensors 110, 111, described below, need not be frequently reoriented. Nevertheless, certain nests, as shown in FIG. 6, must also have larger or smaller "a" or "c" dimensions depending on the component parts to be delivered thereto.

Nosebar 60, in the primary embodiment, is mounted to a slide member 88 as shown in FIGS. 2, 7, 8A and 8B, and when disposed in retracted position, the plurality of arms 53 and arms 55, 56 of nests 50, 51 all abut (or nearly abut) conveyor cover plate 41. Arms 53, 55, and 56 meet plate 41 at points along the front edge of plate 41 that are located between adjacent conveyor guide lanes 42. Thus, each dispensing lane 31 is aligned with a corresponding conveyor guide lane 42 which is in turn aligned with a corresponding nest formed by corresponding nest structures 50, 51. These elements thus create a continuous path from the rear of belt feeder 20 to the front, receiving/pick point area of belt feeder 20.

The internal, motion-generating sub-structures will now be described. These include, generally, a conveyor belt motor assembly and a solenoid-powered slide assembly. The conveyor belt motor assembly provides the driving force to move belt 40. The solenoid-powered slide assembly provides for movement of nosebar 60 and nest structures 50, 51 away from the components on conveyor belt 40 during pickup by the pick and place or robotic assembly machines. This slight movement helps prevent part jamming by relieving any friction and/or back pressure on the components resting inside the nest structures caused by the weight of all the components disposed therebehind. The major parts of these motion-generating sub-structures are disposed, as shown in FIG. 6, under inclined feed portion 24 and behind conveyor feed portion 26 of belt feeder 20.

As to the conveyor belt motor assembly, as shown in FIGS. 5 and 6, a gear motor 70 is operatively mounted in a motor mount structure 72 which is firmly attached to baseplate 27. A driver gear 74 is attached to shaft 76 of gear motor 70 in standard fashion. Driver gear 74 is then disposed in meshing, driving relationship with driven gear 47 on drum 46. When activated, motor 70 turns shaft 76 which rotates gear 74 which drives gear 47 and thereby also belt drum 46 to move belt 40 in the desired direction to feed components. A power connection 77 (shown in FIG. 13) is used to connect gear motor 70 to the control circuitry 80, which will be described in greater detail below. In general, control circuitry 80, 81 governs when gear motor 70 is turned either on, to move the conveyor belt, or off, to stop the conveyor belt.

Control circuitry 80, 81 also controls the activation of the solenoid-powered slide assembly. As shown in FIG. 6, this includes activation of a solenoid 82 which moves a plunger 84 that is pivotally connected to a swing arm 86. Swing arm 86 is also pivotally connected to a slide member 88 to the distal end of which nosebar 60 is attached (see also FIG. 7). Again, as described above, nest structures 50, 51 are mounted on nosebar 60. Thus, upon proper activation by control circuitry 80, solenoid 82 pulls in plunger 84 which pivots swing arm 86 and thereby draws back slide 88. Nosebar 60 and nests 50, 51 move with slide 88 and thus create snug nests for receiving any electrical components to be picked up by the pickup machinery.

Solenoid 82 is operably mounted in a solenoid mount 90 which is rigidly secured to base plate 27. Swing arm 86 is also operably mounted to solenoid mount 90. The swing arm pivot point (fixed axis of rotation) is located at pivotal connection point 83 of swing arm 86 as shown in FIG. 6. At point 83, a shoulder bolt, dowel or other member which allows free rotation of swing arm 86 thereabout may be used to fix the pivoting motion of swing arm 86. A connecting pin 85 is press fit into plunger 84 and clearance fit in swing arm 86 to allow rotatable motion of swing arm 86 thereabout. A dowel or other stop member 87 fixed in mount 90 may be used to provide maximum swing limits for swing arm 86. Stop member 87 is also operably disposed in slot 89 defined in swing arm 86. Thus, the relative sizes of stop member 87 and that of the aperture or slot 89 govern the maximum swing solenoid 82 will impart to swing arm 86. A slip fit pin 91 is press fit into slide member 88. Pin 91 is slip fit in swing arm 86 to allow rotatable movement of swing arm 86 thereabout. Thus, when plunger 89 is properly retracted by solenoid 82, it pulls back on pin 85 which pivotally draws back on swing arm 86. Swing arm 86 thus rotates about bolt 83 and rotatably draws back on pin 91 which thus pulls back slide member 88. Stop member 87 may be predisposed to limit this draw back sequence, but is also used to limit the full forward movement of these members when solenoid 82 is deactivated and spring 92 (disposed around plunger 84) takes over to push outward on plunger 84, slide 88 and thus also ultimately nosebar 60.

FIGS. 8A and 8B show the ultimate result of the movement of nosebar 60. In FIG. 8A, arm 53 of nest 50 is shown very nearly abutting plate 41 and thus creates a tight pocket in which the lead component 95 is snugly disposed. Generally, component 95 is, as shown, disposed in contact with nest structure 50 at this point. This defines the pickpoint that is programmed, in X and Y coordinate space, into the computerized pick and place or robotic assembly machinery. Deactivation of solenoid 82 of the slide sub-assembly moves slide 88, nosebar 60 and nest structure 50 outwardly away from plate 41 and away from component 95 and thus, as shown in FIG. 8B, creates some relief from the back pressure and/or frictional forces that could restrain the free lifting of component 95 from this nest. This relief comes from nest structure 50 being no longer in contact with component 95. The total movement of these nest structures away from the components disposed therein is slight and preferably does not move or provide any impetus for movement of the components in the pockets (though some sizes and/or configurations will provide some, small but acceptable amount of component movement). The spacing between components shown in FIG. 8B is exaggerated to underscore the preferable removal of friction due to contact, not necessarily to show actual movement of the components.

The control means used to trigger these motion-generating sub-assemblies can be any device or combination of devices which triggers conveyor belt 40 to move for a given interval. Preferably, such a trigger is based on an action of the separate pickup machinery, which as herein described, is the physical withdrawal of the pickup machinery head and/or the component from the pick location. One or more optical sensors 110, 111 (see FIGS. 1, 2, 5, 6 and 13) are preferred for sensing this withdrawal and then sending a signal to the other parts of the control means which will then perform the appropriate actions. Electrical circuitry 80, 81 is a primary part of this control system which receives appropriate signals from sensors 110, 111 which then causes the appropriate mechanical responses as described below.

Figure 12:
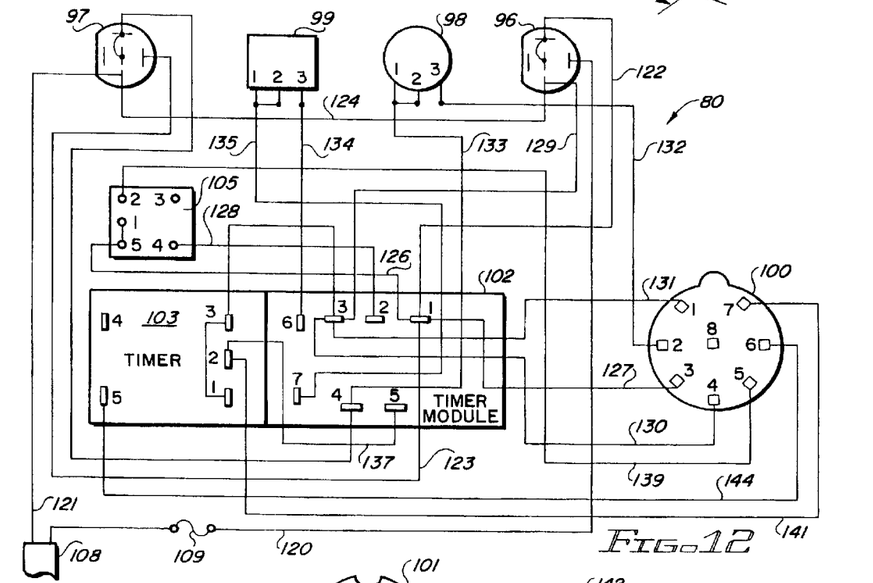
FIG. 12 is a circuit diagram showing the main electrical circuitry of the present invention.
Figure 13:
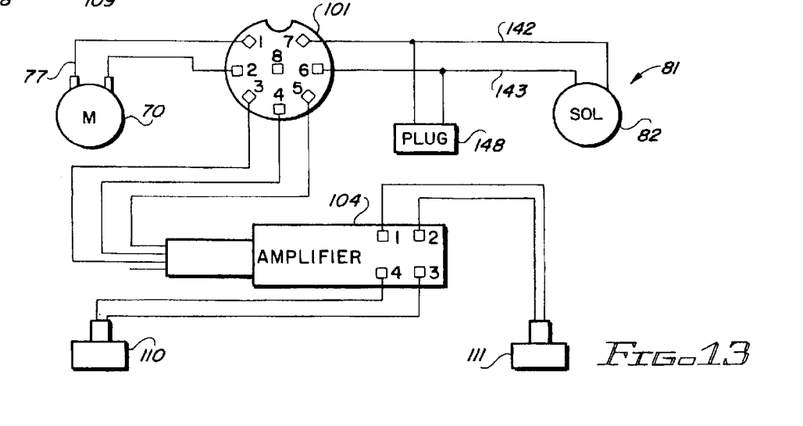
FIG. 13 is another circuit diagram showing the motor, solenoid and sensor circuitry of the present invention which coacts with the main electrical circuitry shown in FIG. 12.

However, before elaborating on the details of a preferred electrical circuitry system (as shown for example in FIGS. 12 and 13), a more general description of the preferred approach will be set forth, particularly with reference to the flow diagram of FIG. 11 in addition to FIGS. 12 and 13. Belt feeder 20 is designed to automate the delivery of electronic components to robotics assembly systems. As a subsystem that can be integrated into any robotic system, belt feeder 20 must be flexible in its characteristics such as in sequencing, component feed rate, dwell time, and braking.

Feeder 20 is turned on by depressing a power button 96 (FIG. 12). At this point, feeder 20 is in an idle mode waiting for an event to happen. An event has occurred when the robotic assembly system removes a component 95 from a nest 50 or 51. As the component pick head removes the component, this breaks the electric eye light beam passing between sensors 110, 111 and sends a signal back to the light sensor amplifier 104 (FIG. 13). Amplifier 104 is programmable to the sensitivity and time period of the break in the light beam. If the break in the light beam qualifies as an acceptable component part pick, then amplifier 104 will provide a contact closure that initiates the belt feed procedure. This corresponds to the uppermost box in the flow diagram of FIG. 11. The belt feed procedure starts with the closure of the main start relay 102 (FIG. 12), which is a time delayed relay, controlled by the dwell potentiometer 99 (FIG. 12 and description below). Thus, motor 70 is activated to run conveyor belt 40 for the period of time set by manipulation of dwell potentiometer 99. Then, motor 70 stops, which stops conveyor 40 and then, in the preferred embodiment solenoid 82 is deactivated and spring 92 pushes nosebar 60 and nests 50, 51 outward from plate 41. As shown in FIG. 11, in an optional embodiment to be described, an intervening process step may be included in which solenoid 172 (FIGS. 16A and 16B) rotates fingers 180 down. This step may be inserted between the stoppage of motor 70 and the deactivation of solenoid 82. Of course, it is preferred that all these actions occur in very quick succession so as to be nearly simultaneous. This is the primary function of the control means, properly sequencing these operations.

Then, another component is picked as shown in FIG. 11 and the cycle starts again. It is preferred that when the sensor initiated signal is sent from amplifier 104 to main relay 102, then the main start relay 102 applies power to a second time delay relay 103 that controls the sequence of activating solenoid 82 to pull nosebar 60 back to plate 41 (and also releasing the optional brake assembly 170 described below) just before starting motor 70 to turn belt 40. Again, nosebar 60 moves nests 50, 51 back toward plate 41 to keep the components at a fixed position in the pick area while belt 40 is moving to prevent parts from jamming at the front of the system. Once more, after the conclusion of the dwell time cycle (the length of time belt 40 is moving), feeder 20 returns to the idle state awaiting either another event or a jog command input.

A control panel contains all of the user variable and actuation controls to operate feeder 20. These controls are shown schematically in FIG. 12. The main power cord 108 also is shown in FIG. 12. Belt feeder 20 can be powered by several sources, either 120VAC, 24VAC, or 24VDC. This power combination provides flexibility for installation in existing robotic assembly systems.

The main power button 96 controls the supply of power to all of feeder 20. Preferably, switch 96 is illuminated which indicates to the user that power has been applied to the system. The second push button 97 is a "jog" control. The jog push-button is used to pre-load the initial components to the picking zone. As tubes of electronic components are loaded into the upper rear end of inclined feed portion 24, the components are gravity fed down through lanes 31 to belt 40 where they are stopped either by the friction of belt 40 or by an optional brake (discussed below). Jog button 97 is then depressed to move belt 40 forward (and release the brake, if installed) to allow the components to move into the picking zone. Jog button 97 is a normally open switch that is also preferably illuminated on contact for user verification. Once jog button 97 has been depressed it overrides the time delay circuitry to directly energize the solenoid and motor elements. These elements then remain energized as long as button 97 is depressed and then de-energize when button 97 is released to return feeder 20 to idle mode.

Belt speed potentiometer 98 is used to limit power to motor 70 thus adjusting the speed of rotation. Motor 70 receives its power from main start relay 102 which also flows through potentiometer 98 thereby limiting the power proportionate to the resistance presented by potentiometer 98 which is manually controlled by the user.

The dwell potentiometer 99 is used to set the duration of motor 70 activation. This variable resistor programs the time delay located in main start relay 102. The time of the sequence is proportional to the resistance presented by potentiometer 99 as manually controlled by the user.

Figures 14, 16A:
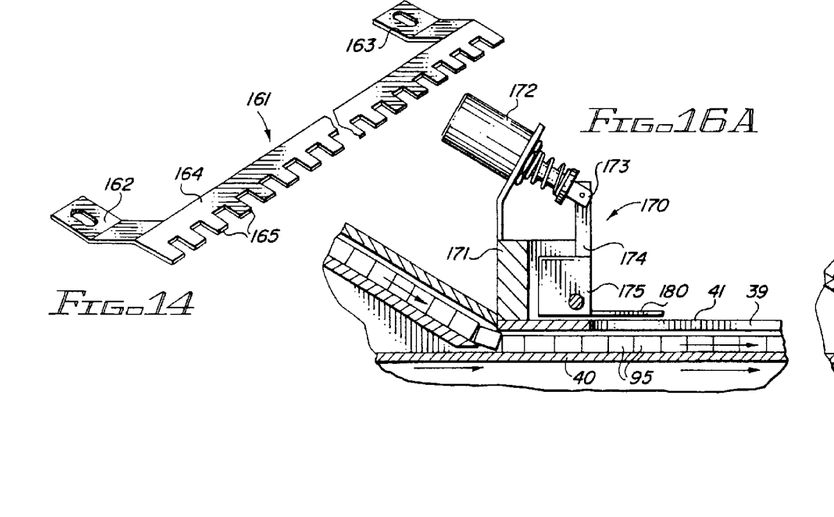
FIG. 14 is an isometric view of an optional component brake assembly for use with the present invention.
FIG. 16A is a side elevational view of an optional solenoid operated part brake assembly in its idle position.
Figure 16B:
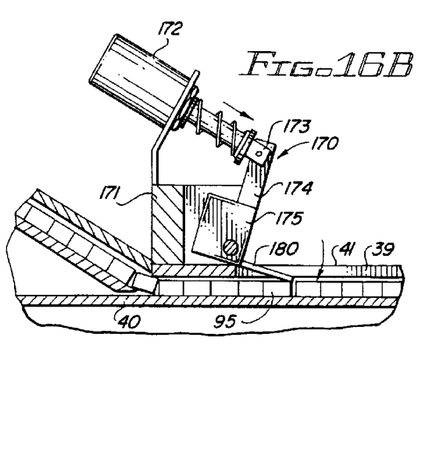
FIG. 16B is side elevational view of the assembly of FIG. 16A showing a finger moved into its operative position.

An optional part brake assembly 170 (as shown in FIGS. 16A and 16B and described in detail below) can be added to the system to prevent components from continuing to move further forward and/or from creating "back pressure" when belt 40 is not moving. The wiring for this optional assembly is preferably paralleled with solenoid 82. Brake 170 is normally in the on position and, when solenoid 172 is energized, brake assembly 170 is released to permit components to flow.

The details of a preferred electrical circuitry configuration for the present invention are shown in FIGS. 12 and 13. Though it is understood that other circuit elements and/or configurations may be used to obtain the above-described functions of the present invention, the preferred circuit details will now be set forth. These circuit diagrams generally include known circuit devices such as push-button switches 96, 97, potentiometers 98, 99, mating male and female PHILMORE plugs 100, 101, two timer relay modules 102, 103, and an amplifier 104 (see FIG. 13). Each of these are connected to each other in generally understood ways. Also, a standard power supply (not shown) provides power as understood through a power cord 108. Note, two general versions of power supply are preferred; one which is a direct 24 volt power source and the other, a common 110 volt source. However, all of the preferred internal circuit components use 24 volts DC; so, a rectifier (not shown) and/or a step down transformer (also not shown) would be needed between the circuitry shown and an AC source and/or a 110 volt source if these other types of power supply are to be used. From this point onward in this description, it will be assumed that 24 volt DC power is supplied.

As shown in FIG. 12, the hot side of power supply cord 108 is connected first to a fuse 109 and then via lead 120 to on/off push-button switch 96 which when properly activated (i.e., pushed to close the circuit) provides power to the other circuit elements. This includes providing a hot connection (via leads 122, 123) to jog push-button switch 97. As described briefly above, when switch 97 is closed, it directly turns on motor 70 to turn gears 74, 47 and drum 46 to move belt loop 40 in standard, continuous conveyor belt fashion. Belt motion would continue for the period of time that switch 97 is physically held closed. Thus, switch 97 provides what is, in effect, a manual override of the timer/sensor portions (to be described) of the rest of the system.

Potentiometers 98 and 99 are connected to manual rotation knobs (not shown) and provide for manual variability of the belt speed and "dwell" (duration of running), respectively. As is known in the art, potentiometers 98 and 99 are connected to the other circuitry in such a way that they can be used as rheostats to vary the resistance and thus vary the current flowing therethrough. Hence, these devices provide power in the form of a variable amount of current to the motor and the integrated circuitry of timer relay 102 to respectively set the motor speed and the on/off ("dwell") time of motor operation duration.

The other lead connected to power cord 108 is return lead 121 representing the common or ground side of the circuit. Thus, the electricity first goes to on/off push-button switch 96 which when open (in the "off" position), disallows current flow. When closed (pushed to the "on" position), the circuit is closed and electricity flows into the circuit, via lead 120, and back to ground via leads 124 and 121.

When "on", hot current also flows through lead 122 to pin no. 1 of timer relay 102, and from there also to jog push-button switch 97 via lead 123, and also to a third relay 105 (pin no. 5 thereof) via lead 126 as well as to the male PHILMORE plug 100 via lead 127. Thus, power is supplied to timer relay 102, the jog switch 97 and, via PHILMORE plug 100, ultimately to amplifier 104 and sensors 110, 111 (shown in FIG. 13). Note, the numbered pin connections of male PHILMORE plug 100 correspond directly to the numbered pin connections of PHILMORE plug 101; thus lead 127 to plug 100 pin no. 3 is directly connectable to plug 101 pin no. 3 which is, in turn, connected to amplifier 104 (and thus also, ultimately to sensors 110 and 111).

Third relay 105 is the relay which initially governs the power supply to all other elements in circuitry 80, 81 (except for "jog" button 97 which as described, is essentially a system override). Relay 105 receives an "on" signal from sensor amplifier 104 (FIG. 13) via lead 139 (FIG. 12) (from PHILMORE plugs 100, 101 pin nos. 5) when amplifier 104 receives the proper signal from sensors 110, 111. Then, according to its understood internal workings relay 105 produces an "on" signal which it sends to pin no. 2 of relay 102 via lead 128.

Pin No. 3 of timer relay module 102 connects timer relay 102 to the overall circuit common ground via lead 129. Here, the connection is shown through the negative terminals of both switches 96, 97 which, again, are connected by lead 124 to plug 108 ground lead 121. Two leads 130, 131 are connected from the PHILMORE plug 100 to Pin No. 3 of relay 102. These leads connect the sensors 110, 111/amplifier 104 subcircuit to the common ground (through lead 130) as well as motor 70 (through lead 131).

Lead 132 goes to PHILMORE plug 100 from potentiometer 98. Potentiometer 98 is also connected at its other end, through lead 133, to Pin No. 4 of timer relay module 102. When properly activated by either pressing switch 97 (to short circuit the timer) or by obtaining the proper timing activation from within timer module 102, hot, output current is caused to flow through lead 133 to and through potentiometer 98 and then through lead 132 to PHILMORE plug 100 where it goes to gear motor 70. This causes motor 70 to run for as long as current is fed thereto. Thus, the duration of depressing button 97 or the duration of current fed from pin no. 4 of relay 102 determines the length of time that motor 70 runs. Potentiometer 98 allows for manual variation of the resistance to current through leads 132, 133 to thus present a variable current to and thus a variable speed for motor 70. Thus, potentiometer 98 governs the speed of conveyor belt 40.

The duration of current output from pin no. 4 of relay 102 is governed by the signals running between pin nos. 6 and 7. Current runs between pin nos. 6 and 7 of relay 102 through lead 134, potentiometer 99 and lead 135. Thus, potentiometer 99 provides for manual variation of the current running through this isolated circuit loop which timer relay module 102 interprets and performs the necessary understood internal logic functions based thereon to present a corresponding time period of current output from pin no. 4. This then controls how long motor 70 receives power which in turn governs the length of time that belt 40 is caused to run.

Pin no. 5 of timer relay module 102 is connected via lead 137 to the second pin of a second relay 103 which ultimately controls solenoid 82. Pin no. 5 of relay 102 sends an output current to solenoid relay 103 which initiates relay 103 to perform internal logic to delay opening the solenoid circuit which runs from relay 103 pin no. 2 to solenoid 82 via leads 141, 142 and back through leads 143 and 144 to relay 103 pin no. 5. After the proper delay period, a current flow is established from the second pin of solenoid 103 to PHILMORE plug 100 (pin no. 7) along lead 141 which continues to solenoid 82 (see FIG. 13) via lead 142 and returns via lead 143 to and through plugs 100, 101 (pin nos. 6) to pin no. 5 of relay 103 via lead 144. Relay 103 is grounded to and through pin no. 3 of relay 102. This current to solenoid 82 is operative to energize the solenoid coil (not shown) to suck in plunger 84 which pulls inward swing arm 86 which, in turn, pulls back slide member 88 so that nests 50, 51 come back to and substantially abut cover plate 41 and create the proper receiving position (i.e. "nest") for component(s) 95 that will be fed thereto.

Plug 148, shown in FIG. 13, makes available the below-described option of including a solenoid-operated component part-brake assembly 170 (shown in FIGS. 16A and 16B). Plug 148 provides for assembly 170 to receive parallel power simultaneously with solenoid 82. Thus, assembly 170 would be able to operate simultaneously with solenoid 82 or be delayed therefrom if an external delay relay (not shown) is included between plug 148 and assembly 170. Assembly 170 will be addressed in greater detail as an optional addition below.

Time delay relay 103 preferably contains a third potentiometer (not shown) located, by the manufacturer, on the surface of relay 103 to set the time differential between solenoid 82 activation and motor 70 activation. This sets the delay period from the receipt of an activating signal on pin no. 2 of relay 103 and the closure of an operative solenoid circuit from relay 103 pin no. 2 to relay 103 pin no. 5. This third potentiometer is not intended to be frequently user variable; rather is intended to be preset during the manufacturing process. Feeder 20 may also contain a relay (not shown) that performs logic inversion for the optional brake 170 and nosebar 60. Such a relay would provide the flexibility in the hardware mechanical system to be adaptable to use either a push or pull solenoid for either the optional brake 170 or nosebar 60. However, the brake and nosebar as shown in the preferred circuitry would preferably have the same mode (push or pull) of operation.

The manufacture of a belt feeder 20 according to the present invention follows fairly conventional techniques for machining and assembling the various parts. More specifically, almost all of the parts are made from metal, such as from aluminum (6061-T6) or stainless steel (303 S.S.). These parts are cut, drilled, routed or otherwise shaped or formed according to known procedures and they may also be plated or otherwise processed after forming; including, for example, sulfuric anodizing (black) or electroless nickel plating.

The generally non-metallic, pre-manufactured parts included in the present invention comprise, for example, the circuit components and the belt. The belt may be made of any known material such as leather, fabric or rubber, or the like. The preferred belt 40 is from BELT POWER, part number U8W. The preferred electrical components include optical sensors 110, 111 and amplifier 104 from KEYENCE, numbers PS-52 and PS2-61; push-button switches 96, 97, NKK numbers KB16CKW01-01JE/GENC and KB15CKWO128JF; PHILMORE male and female in-line plugs 100, 101, numbers L-700 and T-700; CLAROSTAT potentiometers 98, 99, 308NPC-100K and 733A, 100Ω, 10 turn, 2 watt; and timer relay modules (102 and 103) from AEROTRONICS, numbers TEL4010B1H and TGL4001A1H (2747 Route 20 East, Cazenovia, N.Y. 13035). The primary solenoid (82) is preferably a GUARDIAN, T 12X19-I-24VDC. A plunger, made of 1018 MI4D steel, and a spring, CENTURY SPRING, S-1321, are used therewith. Motor 70 is preferably a Pittman gear motor manufactured by Pittman, Inc., Harleyville, Pa. 19438-0003. The third relay 105 is preferably an OMRON, GSLE-114P-PS-24 VDC.

The details of the internal structures of these components (particularly relays 102, 103 and 105) will be known to and/or understood by those skilled in the relevant art. Thus, it will be understood how these devices, in this preferred embodiment, operate and what other structures are equivalents thereto.

Assembly of the various parts is, as shown in the drawings, performed according to known methods. Herein, various types of screws, bolts or like fasteners are used to attach many corresponding parts to one another. Means understood to be equivalent may also be used.

A brief description of one cycle of operation using generic terminology will now be presented in order to illustrate the coaction of the principal portions of this invention. First, belt feeder 20 is positioned in or near an electronics assembly line. Then, a preselected type or types of components are inserted into the back end of the inclined dispensing means. These components slide down through the lane or lanes of the dispensing means to the conveyor means. While the conveyor means is not in operation, these components are temporarily "stored" in the dispensing means. Then, one at a time, as the conveyor means is activated (initially by depression of the "jog" button) the components from the dispensing means are moved to the conveyor means. The conveyor means then advances the components forward toward the receiving means. This also allows each next component in line to move from the dispensing means to the conveyor means. This process continues until the conveyor means lane or lanes are filled with waiting components and each first component is moved into a corresponding "nest" in the receiving means. A plurality of parallel lanes can be used to fill a plurality of parallel nests. So long as the conveyor means is in operation (belt 40 is moving), the receiving means is in retracted position, defining snug "nests" in which the lead components are held appropriately aligned for pickup by the programmable pick and place or robotic assembly machinery. These lead components must be held snug by circumferential contact with the receiving means nest structures 50, 51 so that they are properly oriented when the pick head arrives immediately thereover to "pick" the component up from the receiving means nest area. However, when the conveyor means stops operating (belt 40 stops moving), the receiving means may then be moved a slight distance outward from the components for assembly pickup. The components preferably do not move with the receiving means, rather this action merely removes physical contact of the nest structures with the components so that the back pressure and friction do not act to oppose the pickup action of the pick and place or robotic assembly machine. Thus, a pickup machinery head then comes to a position just over the receiving means nests, picks up one or more components from the nests and then moves away to place these in an electronics assembly. The control means, detecting that the pickup machine head has picked a component (or components) and/or that it has left the vicinity of the receiving means, immediately triggers the control circuitry to initiate the retraction of the receiving means and the forward movement of the conveyor means for an interval of time long enough to allow the next component to advance into the now vacant receiving means nest or nests. The other components in the guide lane behind the "picked" component(s) also advance on the conveyor means and one or more further components are dispensed from the inclined dispensing means to the conveyor means.

As mentioned, the conveyor means does not operate continuously throughout a cycle, rather, the conveyor means starts and stops in a sort of synchronization with the action of the pick and place machine. This thus avoids abrasive wear on components which appears to be prevalent in the belt feeder art. As this process or cycle continues, the number of components in the feeder is reduced, however, the dispensing means can be refilled as the need arises without interrupting or interfering with the overall operation between of belt feeder and the pickup machinery.

It should here be noted that the start/stop operation of the conveyor means may be used independently from the retraction/extension operation of the receiving means. Each has separate utility (for the reduction of conveyor belt component grinding and for the reduction of back pressure/ frictional forces, respectively) as well as coactive benefits.

The detailed operation of belt feeder 20 will now be presented. Belt feeder 20 is designed to be used with an electronics assembly system and is preferably base mounted on a table or bench top surface. Bolts, for example, may be used to secure base 27 to the mounting surface. The interchangeable feeder parts, inclined plate 30 (its associated cover(s) 32, 33), conveyor cover plate 41, and nest structures 50, 51, are secured to the belt feeder prior to operation. These interchangeable parts may be replaced without removing base 27 or any other part of belt feeder 20 from its table or bench top surface. Belt feeder 20 can be configured to operate on a power level of 120VAC, 24VAC, or 24VDC.

To make belt feeder 20 ready for operation, electronic components to be fed to the assembly pick and place or robotic machinery are bulk loaded into the appropriate corresponding dispensing lanes 31 from the upper rear openings of inclined feed portion 24 of belt feeder 20. The components then slide down through dispensing lanes 31 (preferably under the impetus of gravity) until the first component in each lane meets with conveyor belt 40. The power system is activated (turned "on") by depressing on/off push-button switch 96 once. Next, jog push-button switch 97 is depressed to activate conveyor belt 40 to then advance the components in their respective conveyor guide lanes 42 until each first component arrives at and enters into its respective nest structure 50 or 51. The jog switch 97 is then released. A sample component may then be removed from its nest structure 50 or 51 and optical sensors 110 and 111 will detect the removal (by the breaking and recompletion of the beam circuit) and automatically restart belt movement to replace the missing component with the next component in that lane. Sensors 110 and 111 may need to be physically adjusted because they should be located in the position closest to matching the common component centerline. It may also be necessary to adjust springs 150 to provide more or less downward pressure on the electrical components moving through the transition area 152 from inclined feed portion 24 to conveyor belt 40 to provide a smooth flow of components from each dispensing lane 31 to each conveyor guide lane 42. Belt feeder 20 is now set-up and ready for automatic operation.

As it will be preprogrammed (in known fashion) to do, the pick and place or robotic machine head (hereafter "pick head") (not shown) will repetitively arrive at a location immediately above the nest structure or structures which hold the component or components to be "picked." If the solenoid-operated nosebar is not being actively used, then the nests remain in position defining the pickpoints. The pick head then breaks the optical sensor beam and picks up one or more components from one or more nests for placement in a circuit board or other electronic assembly. When the pick head has completed its "pick" it leaves the vicinity of the pick location. The optical sensor beam is then recompleted between sensor 110 and 111, i.e., is re-unobstructed which thereby triggers the conveyor belt to move to advance the next component in each lane into the empty nest or nests. The pick head may then return and repeat the cycle anew.

If, as is preferred, the solenoid-operated, nest-moving assembly is also used, the pick head will be programmed to arrive at the location immediately above the appropriate components after the nest structures have been moved (by solenoid activation) out, slightly away from the components. Then, once the pick head leaves and the optical sensor beam circuit is thereby recompleted, this causes, by means of the control circuitry, both the movement of the nest structures back to the conveyor cover plate, and the advancement of the components on the conveyor belt.

Either way, the speed of conveyor belt 40 (as set by potentiometer 98) determines how fast belt 40 moves new components to nests 50, 51 to replace picked components therein. The belt dwell or time duration (as set by potentiometer 99) determines the period of time that conveyor belt 40 continues to move after it is restarted by the sensor signal. Belt speed is preferably set to keep pace with the pick and place machine activity. The speed should be at least fast enough to ensure that the nests are refilled before the pick head returns for a new mission. Belt dwell time is determined by the length of the longest component being picked. Belt dwell time should be manually set to be long enough to allow the longest component to move completely from its conveyor guide lane 42 into its corresponding nest 50 or 51.

The system as described above is implemented in an electromechanical circuit. However, the circuitry can also be implemented using digital controls. This increases the flexibility and timing of the system, while maintaining all of the same mechanical components, gear motor 70, solenoid 82, for example. The system is then sequenced and timed using software (or firmware, etc.) located within the digital controls. This allows changes to the timing of the dwell, motor, brake, power-on, jog, speed and nosebar movement without any hardware changes to the system.

Please note also that regardless whether the preferred circuitry, described here, or digital controls are used in feeder 20, the details of the logic structures (firmware, software, microprocessors or otherwise) are known or will be readily understood by those skilled in the art. Thus, even if the separate timing, delay or other related means for controlling the motor(s) and/or solenoids are incorporated in one or more structures expressly disclosed here, those skilled in the art will know how to replicate this invention using the disclosed structures or their equivalents (firmware, software, microprocessors or the like).

There are numerous optional structures available for performing the desired functions. One optional dispensing means for delivering components to the conveyor means of this feeder is through tube feeding. In other words, one or more tube feeders could be substituted for or attached to (above and behind) the inclined plate-type feed portion 24 described here. Tube feeding is generally well-known in the vibratory and other oscillatory component feeding arts. Such feeding usually involves apparatus designed to hold one or more component tubes in an inclined and/or a ski-slope position relative to the conveyor belt or receiving means which receives the components delivered therefrom. Multiple variations of such apparatuses are readily taught in the art and either these or obvious variations thereof may be simply incorporated herein. The tubes themselves are of known types such as anti-static storage and/or shipment tubes.

Each of the plurality of optional springs 150 shown in FIGS. 1 and 3 may be included to assert a stabilizing downward force on the electronic components (not shown) as they emerge from lanes 31. Flexible ends 151 contact the components as they pass by springs 150. This force prevents the electronic components from jamming, popping up or otherwise becoming misoriented during their transition from their respective dispensing lanes 31 through junction space 152 into respective conveyor track lanes 42. This option is particularly useful for the delivery of smaller parts.

Another option available herewith includes a part brake assembly 161 as shown in FIGS. 14, 15A and 15B that may readily be attached to a belt feeder 20. Belt brake 161 is disposed inside belt loop 40 and is, in one optional embodiment, mounted to transverse extensions (not shown) of slide member 88. Otherwise, brake 161 may be fixedly secured to base 27 of housing 22. Either way, at each lateral end of brake 161 are mounting brackets 162, 163 which are used to attach brake 161 to slide member 88 (or base 27) thereby holding belt brake 161 in operable position. In the movable option, brake 161 is, as shown in FIG. 15A, initially substantially underneath junction gap 152 adjacent the rearward end of belt support plate 45 (see also FIG. 5). Upper cross portion 164 of belt brake 161 is thus disposed in movable contact with the undersurface of the upper belt loop portion 43 as shown in FIGS. 15A and 15B. This optional belt brake 161 moves with slide member 88 and when moved into braking position (FIG. 15B), puts an upward force on belt 40 which thus forces any and all components located directly above brake 161 on belt 40 to be pinned between brake 161 and the undersurface of conveyor cover plate 41. This relieves the back pressure on the components disposed in the receiving nests 50, 51 of the weight of all the components behind brake 161. Thus, the components will not have such back pressure to cause jamming in nests 50, 51. Numerous protrusions 165 are formed on cross portion 164 to make brake 161 adaptable to handle a varied lateral load. Thus, protrusions 165 allow cross portion 164 to deform more or less at different lateral points depending on the weight of the components disposed on the portion of belt 40 immediately superjacent thereto. The movement and deformation shown in FIG. 15B is exaggerated.

In another embodiment, brake 161 is fixedly attached to base plate 27 and thus does not move relative to the housing. In this way, it causes a slight, continuous hindrance to the forward movement of all components disposed on belt 40. This, thus arrests some, but not necessarily all "back pressure." However, in certain applications, this is sufficient for arresting the back pressure associated with some kinds of components.

As shown in FIGS. 16A and 16B, a different optional part brake assembly 170 may be used with the present invention. Assembly 170 includes a solenoid 172 which mechanically moves one or more finger(s) 180 down onto components 95 as they ride on conveyor belt 40. Fingers 180 fit in and move through slots 39 which are defined in plate 41. FIG. 1 shows an isometric view of slots 39. Solenoid 172 is distinct from solenoid 82 but may run parallel therewith as mentioned above if it is connected to plug 148 as described. Solenoid 172 is mounted to base 171 which is detachably attachable to either side wall 28 or 29 of feeder 20 via threaded connections 34. Plunger 173 of solenoid 172 is pivotally connected to extension arm 174 of finger assembly 175. Finger assembly 175 has one or more finger(s) 180 and is pivotally mounted to base 171. In operation, solenoid 172 would receive the same power "on" signal that goes to solenoid 82 and would thus be operable simultaneously therewith. The use of one or more other relays or other delay mechanisms (not shown) would preferably be used to achieve the series of operational steps shown in FIG. 11. Specifically, first, the motor/conveyor is stopped, then, solenoid 172 is signalled to rotate finger(s) 180 down and then, solenoid 82 is deactivated so that nosebar 60 is moved out. Other sequences or simultaneous actions may also achieve substantially the same result. Note again that solenoid 172 and solenoid 82 may, in many understood ways, be made to operate both in "push" mode, both in "pull" mode, or one pushing while the other is pulling. Further, it may be that one is activated ("energized") by the flow of electricity while the other is simultaneously de-activated. These also are within the known skill in the art.

From the foregoing, it is readily apparent that a new and useful embodiment of the present invention has been herein described and illustrated which fulfills all of the aforestated objects in a remarkably unexpected fashion. It is of course understood that such modifications, alterations and adaptations as may readily occur to the artisan confronted with this disclosure are intended within the spirit of this disclosure which is limited only by the scope of the claims appended hereto.

Accordingly, what is claimed is:

1. A belt feeder for component delivery to pickup machinery, said belt feeder comprising:

a housing, and disposed on or connected to said housing;

a receiving means for receiving one or more components for pickup by pickup machinery;

a conveyor means for intermittently moving said components to said receiving means, said conveyor means being disposed adjacent to and extending under said receiving means and comprising a belt having a plurality of component lanes for moving said components in said lanes;

a dispensing means for dispensing said components to said conveyor means, said dispensing means being disposed sufficiently near said conveyor means so that said components advance from said dispensing means to said conveyor means; and a means for controlling the intermittent movement of said conveyor means in response to the pickup of a component by said pickup machinery, said controlling means being communicatively connected to said conveyor means; said controlling means comprising a sensor for detecting the removal of a component by said pickup machinery thereby powering up said belt to feed a subsequent component in response to said removal of a component by said pickup machinery, said sensor being in communicative contact with said powering means.

2. A belt feeder according to claim 1 which further comprises:

braking means for intermittently braking the movement of one or more components on the belt of said conveyor means.

3. A belt feeder according to claim 2 in which said braking means includes a belt brake which is in frictional contact with said belt.

4. A belt feeder according to claim 2 in which said braking means includes a component brake assembly which is disposed above said conveyor means and which has a finger which is intermittently moved down toward said conveyor means to intermittently halt the movement of one or more components disposed on said conveyor means.

5. A belt feeder for component delivery comprising:

a housing;

receiving means connected to said housing for receiving one or more components for pickup by pickup machinery;

conveyor means connected to said housing for intermittently moving said components to said receiving means, said conveyor means being disposed adjacent said receiving means and including a belt for moving said components;

dispensing means connected to said housing for dispensing said components to said conveyor means, said dispensing means being disposed sufficiently near said conveyor means so that said components advance from said dispensing means to said conveyor means; and reciprocating means for moving said receiving means alternately away from a component to be picked up and back to component receiving position; said reciprocating means including a solenoid with a metallic plunger operably disposed therein, said solenoid being securely mounted within said housing;

a swing arm pivotally connected to said plunger; and a slide member pivotally connected to said swing arm and attached to said receiving means.

6. A belt feeder according to claim 5 which further comprises:

means for controlling the intermittent movement of said conveyor means and the reciprocating movement of said reciprocating means relative to each other and in response to the pickup of a component by pickup machinery, said controlling means being communicatively connected to said conveyor means and said reciprocating means.

7. A belt feeder according to claim 5 which further comprises:

braking means for intermittently braking the movement of said components by said conveyor means to said receiving means; said braking means being operatively attached to said reciprocating means so that said braking means intermittently brakes the movement of said components.

8. A belt feeder according to claim 5 wherein said receiving means comprises a nest structure for receiving and holding a component after said component advances along said conveyor means into said nest structure; said nest structure being disposed adjacent to said conveyor means at the forward end of said belt.

9. A belt feeder according to claim 1, wherein said sensor includes an optical beam sensor with a transmitter and a receiver; said transmitter and said receiver being mounted adjacent said receiving means to project an optical beam from said transmitter to said receiver; and wherein said powering means comprises a conventional power source, a motor operably connected to said power source, and electrical wiring to connect said motor through control circuitry to said sensor; whereby said sensor sends a signal in response to a pickup of a component to said control circuitry which thereby provides power to said motor for the intermittent movement of said belt.

10. A belt feeder according to claim 5 which further comprises:

means for controlling the reciprocating movement of said reciprocating means in response to the pickup of a component by pickup machinery, said controlling means being communicatively connected to said reciprocating means.

11. A belt feeder according to claim 10 wherein said controlling means comprises a sensor for detecting the pickup of a component by said pickup machinery and means for powering said belt whereby said belt moves intermittently in response to a pickup of a component by said pickup machinery thereby allowing the smooth and rapid advancement of subsequent components when a component has been picked up by said pickup machinery, said sensor being in communicative contact with said powering means.

12. A belt feeder according to claim 5 which further comprises:

braking means for intermittently braking the movement of one or more components on the belt of said conveyor means;

said braking means including a component brake assembly which is disposed above said conveyor means and which has a finger which is intermittently moved down toward said conveyor means to intermittently halt the movement of one or more components disposed on said conveyor means.

13. A belt feeder according to claim 12 which further comprises means for controlling the braking movement of said braking means in response to the pickup of a component by said pickup machinery.

14. A method for controlling the intermittent delivery of components to a receiving means for ultimate pickup by pickup machinery, said method comprising:

dispensing one or more components to a conveyor means having a multiple lane conveyor belt;

moving said conveyor belt;

halting said conveyor belt for a period extending beyond the arrival of said components at said receiving means for pickup of a component by said pickup machinery;

sensing the pickup of said component adjacent said receiving means and on said belt by said pickup machinery;

sending a signal to said conveyor means in response to said pickup of said component by said pickup machinery;

moving said conveyor belt for a selected period of time in response to said signal whereby a subsequent component is then in position for pickup by said pickup machinery.

15. A method according to claim 14 which further comprises the steps of:

sending a signal to a retractable component receiving means in response to said pickup of said component by said pickup machinery;

retracting said retractable component receiving means in response to said signal to receive a component in a nest defined in said receiving means for pickup of said component by said pickup machinery;

moving the nest of said retractable component receiving means away from said component received therein.

* * * * *